United States Patent [19]

Gillaspie

[11] Patent Number: 4,777,657
[45] Date of Patent: Oct. 11, 1988

[54] COMPUTER CONTROLLED BROADBAND RECEIVER

[75] Inventor: Norman J. Gillaspie, Menlo Park, Calif.

[73] Assignee: ISS Engineering, Inc., Menlo Park, Calif.

[21] Appl. No.: 33,137

[22] Filed: Apr. 1, 1987

[51] Int. Cl.$^4$ .................... H04B 1/18; H04B 1/16; H04B 1/08

[52] U.S. Cl. .................... 455/186; 455/300; 455/343; 455/349

[58] Field of Search ............... 455/161, 166, 168, 180, 455/179, 3, 277, 4, 7, 300, 158, 314, 343, 347, 183, 186, 348, 349; 375/8; 358/191.1, 192.1; 364/514; 342/361, 362, 377, 419

[56] References Cited

U.S. PATENT DOCUMENTS

| | | | |
|---|---|---|---|
| 4,313,213 | 1/1982 | Farina et al. | 455/158 |
| 4,429,418 | 1/1984 | Hooper | 455/314 |
| 4,446,564 | 5/1984 | Pierce | 375/8 |
| 4,456,925 | 6/1984 | Skerlos et al. | 364/514 |
| 4,509,198 | 4/1985 | Nagatomi | 455/4 |
| 4,538,175 | 8/1985 | Balbes et al. | 455/3 |
| 4,620,289 | 10/1986 | Chauvel | 364/514 |
| 4,710,972 | 12/1987 | Hayashi et al. | 455/179 |

Primary Examiner—Robert L. Griffin
Assistant Examiner—Curtis A. Kuntz
Attorney, Agent, or Firm—Flehr, Hohbach, Test, Albritton & Herbert

[57] ABSTRACT

A programmable signal receiver for use in a computer system. The signal receiver is located inside the computer's chassis and has an interface directly coupled to the computer's bus for receiving instruction signals which specify one or more channels to be selected from a broadband input signal. Each selected channel of the broadband signal is amplified using amplifying circuitry of sufficiently low impedance that the RF radiation produced does not interfere with the operation of the computer system. In one embodiment the signal receiver's input port is d.c. coupled to the computer's d.c. power supply so that the computer's d.c. power supply can be used to provide power to apparatus external to said computer system—such as a satellite dish's feed horn.

8 Claims, 3 Drawing Sheets

COMPUTER CONTROLLED BROADBAND RECEIVER

The present invention relates generally to a programmable signal receiver, and particularly to a computer controlled receiver which can be installed in a microcomputer and can be used to receive, amplify and demodulate one or more selected signals within a broadband signal source.

BACKGROUND OF THE INVENTION

The prior art includes a large number of receivers, sometimes called channel tuners. These devices are used for tuning to (i.e., receiving) a particular channel of a wideband signal—such as a wideband satellite signal, or a band of television signals transmitted through the atmosphere or via cable.

There are numerous circumstances in which it would be convenient to control a tuner with a computer which is also used for other purposes. For instance, it would be desirable to be able to use a personal computer to receive data transmitted on a particular satellite channel at a specified time.

Note that the present invention is not concerned with systems such as video cassette recorders which have a dedicated microcontroller inside the receiver, because such systems do not provide users with the broad range of data processing capabilities provided by microcomputers and larger computer systems.

Using currently available technology, it would be feasible to control an external tuner with a computer by transmitting control signals through one of the computer's ports, typically an RS232 serial port. The tuner in such a prior art system would be external to the computer for at least two reasons: (1) because tuners are traditionally located inside devices such as televisions, radios, and the like, and (2) because the RF (radio frequency) noise from the computer would interfere with the operation of the tuner.

It is well known to those skilled in the art that virtually all general purpose computers generate substantial amounts of RF noises. In the U.S. the amount of RF noise that can be generated by computer is regulated by the government. Nevertheless, the strength of the RF noise generated by even small computer systems is typically more than sufficient to corrupt weak signals, such as satellite signals picked up by a satellite antennae. Therefore prior art satellite receivers have been self contained, external units with their own power supply and control circuits.

It should also be noted that the amount of RF noise inside the housing of a typical computer is at least several orders of magnitude more than the RF noise measured external to the computer. Government RF noise regulations currently apply only to RF noise measured external to the computer.

Having the tuner external to the computer is a shortcoming because the tuner will need a separate power supply from the computer. Also, if the output of the tuner is data to be processed by the computer, an additional interface will be needed to coupled the output of the external tuner to the computer's data bus.

Another shortcoming of using an external tuner is that it is difficult to simultaneously control two or more tuners through a serial port. Of course, a special interface and protocol could be designed to control multiple external tuners through a single serial port, but this would also add to the expense of the system.

The present invention provides a channel tuner which is included inside a computer such as a personal computer. The channel tuner is coupled to the computer's bus so that commands can be sent to the tuner by directly sending data to one or more addresses corresponding to the tuner. If several tuners are provided, each is given a separate address in the computer's address space.

The channel tuner described herein can be housed inside the computer because the sensitivity of the tuner to RF radiation has been reduced through the use of low impedance circuitry, and also be shielding some of the tuner components from RF radiation.

Another feature of the present invention is that the d.c. power needs of the signal source, such as a satellite feed horn polarization controller, can be provided by the computer's own power supply. The power is transmitted to the signal receiver using the same cable used to transmit signals from the signal source to the tuner in the computer.

While the present invention is quite simple in concept, it substantially reduces the cost of satellite and other channel tuners, and it also substantially simplifies the delivery of transmitted data to a computer.

SUMMARY OF THE INVENTION

In summary, the present invention is a tunable signal receiver for use in a computer system. The signal tuner is located inside the computer and has an interface directly coupled to the computer's bus for receiving instruction signals which specify one or more channels to be selected from a broadband input signal.

Each channel tuner typically includes a voltage controlled oscillator and a phase locked loop for generating a mixing signal with a frequency corresponding to the selected channel, and a tracking filter mixer for combining the broadband signal with the mixing signal. The output of the tuner is then amplified using amplifying circuitry of sufficiently low impedance that the RF radiation produced by the computer does not corrupt the signal being received.

In the preferred embodiment, the receiver is an add-on board which is mounted inside the computer chassis. Most general purpose computers provide at least one backplane port for removably connecting apparatus to the computer's bus. The add-on receiver board has an input/output connector which removably plugs into such a backplane port. Thus the receiver can receive and transmit data directly to the computer's bus. However, it is also in close proximity with computer circuitry that generates substantial RF noise. As discussed above, the amount of RF noise generated inside most general purpose computers is more than sufficient to corrupt satellite and similar signals while such signals are being amplified and demodulated in a conventional signal receiver.

In one embodiment the receiver's input port is d.c. coupled to the computer's d.c. power supply so that the computer's d.c. power supply can be used to provide power to apparatus external to said computer system—such as a satellite dish's feed horn.

For systems to be used to receive digital data, one of the tunable signal receivers includes a digital demodulator, which generates a stream of digital data, and a serial to parallel converter (such as a UART) for routing the stream of digital data from the demodulator to the computer's bus.

BRIEF DESCRIPTION OF THE DRAWINGS

Additional objects and features of the invention will be more readily apparent from the following detailed description and appended clams when taken in conjunction with the drawings, in which.

DESCRIPTION OF THE PREFERRED EMBODIMENT

Figure 1:
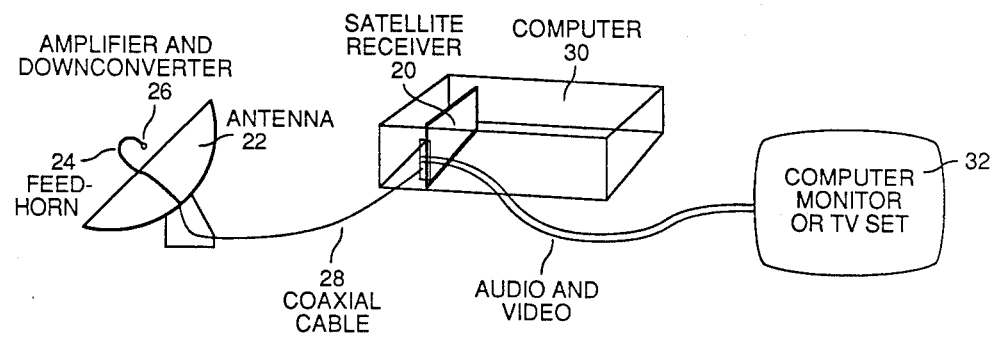
FIG. 1 is a conceptual drawing of a satellite receiver using the present invention.

Referring to FIG. 1, there is shown a conceptual drawing of a satellite receiver 20 using the present invention. As shown, a satellite antennae 22 reflects a broadband signal (typically 3.7 to 4.2 GHz) to a feedhorn 24. The feedhorn conveys the input signal to an amplifier and downconverter 26 that translates the satellite microwave signal into a 950 to 1450 MHz broadband, multichannel signal 27 suitable for processing by a receiver.

The translated, broadband satellite signal is transmitted to the receiver 20 by a coaxial cable 28. In the preferred embodiment, the receiver is an add-on board which is mounted inside the computer chassis. Most general purpose computers provide at least one backplane port for removably connecting apparatus to the computer's bus. The add-on receiver board has an input/output connector 47 (shown in FIG. 2) which removably plugs into such a backplane port. Thus the receiver can receive and transmit data directly to the computer's bus.

Outputs from the receiver 20 in this example include video and audio signals suitable for use in a standard television set 32.

Figure 2:
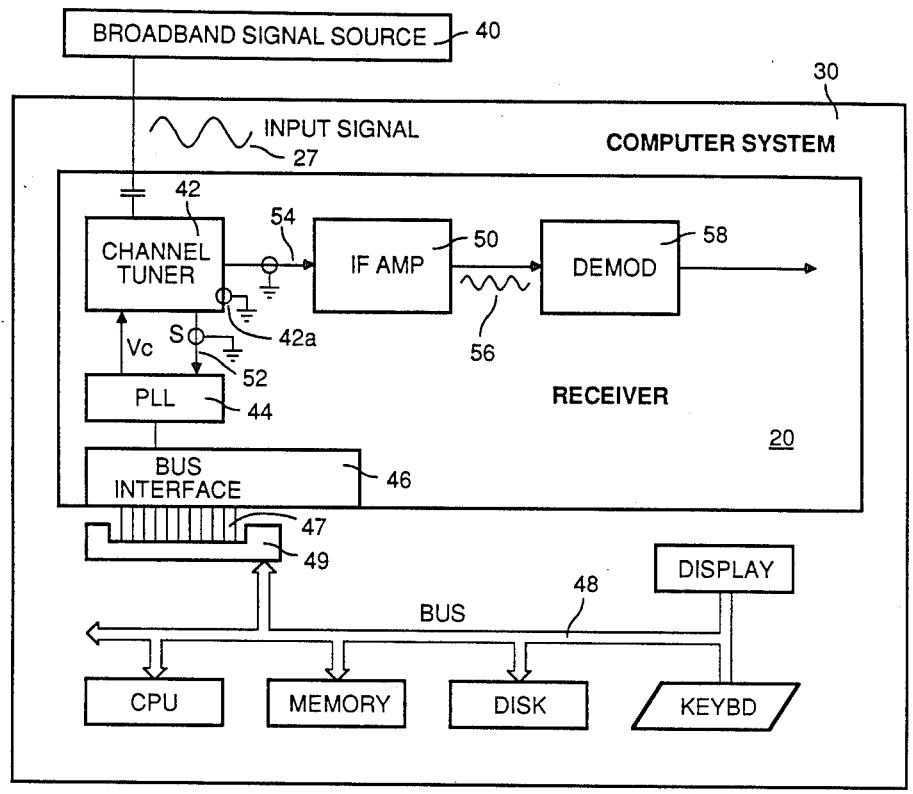
FIG. 2 is a block diagram of a programmable receiver in accordance with the present invention.

Referring to FIG. 2, there is shown a block diagram of a programmable receiver 20 in accordance with the present invention. The output of a broadband signal source 40 is a.c. coupled to a tuner 42 in the receiver 20. In different applications the signal source could be a satellite antenna, a television cable, a television antenna, or a microwave antennae.

In the preferred embodiment, the tuner 42 is a video (950 to 1450 MHz) channel tuner which is shielded by a grounded metal covering 42a to protect the input signal 27 from RF radiation generated by the computer system 30. The tuner 42 includes a voltage controlled oscillator (VCO) for generating a mixing signal with a frequency corresponding to a selected channel, and a tracking filter mixer for combining the broadband signal with the mixing signal. The frequency of the mixing signal is controlled by a phase locked loop (PLL) 44, which monitors a sample output S from the VCO in the tuner and automatically adjusts the VCO's control voltage Vc until the VCO generates the selected mixing signal.

The PLL 44 is programmed by the computer 30 through a bus interface 46. In other words, the computer 30 sends data through the data bus 48 to a predefined address. The bus interface 46 channels that data to the PLL 44, which latches in the data. The data stored in the PLL 44 defines the target frequency of the mixing signal used in the tuner 42.

Since the receiver 20 is intended for use in a general purpose computer, it is assumed that the computer 30 includes the standard components, including a central processing unit (CPU), random access memory, disk storage, keyboard, monitor, and at least one backplane port 49 for removably coupling the computer's bus 48 to an add-on board such as the receiver 20.

As discussed above, the amount of RF noise generated inside most general purpose computers is very intense, and certainly more than sufficient to corrupt satellite and similar signals while such signals are being amplified and demodulated in a conventional signal receiver. To allow the receiver 20 to mounted inside a general purpose computer, several features are needed to protect the input signal from this RF noise.

One such feature is that the output of the tuner 42 is amplified using amplifying circuitry 50 of sufficiently low impedance that the RF radiation produced by the computer does not corrupt the signal being received. In the preferred embodiment the amplifiers used are monolithic gain blocks, each having a fifty ohm input and a fifty ohm output impedance. Such monolithic gain blocks are currently available from Avantek, Mini Circuits Labs, NEC, and possibly other manufacturers.

Other features for protecting the input signal from corruption by RF noise include shielding the tuner 42, shielding the VCO sample line 52—to prevent the PLL 44 from responding to RF noise and thereby corrupting the mixing signal generated by the VCO in the tuner 42, and shielding the output line 54 of the tuner 42 if this line is more than an inch or two in length. Furthermore, the output of the tuner 42, herein called both the selected channel signal and the IF (intermediate frequency) signal, is amplified before any other signal processing is performed to minimize the effect of the RF noise in the computer 30 on the selected channel signal.

The inventor has found that the above described combination of noise protection features permits reliable reception of the data in a satellite microwave signal even when the receiver is placed inside a computer 30 which generates the maximum amount of RF noise allowed by U.S. federal regulations. Since satellite signals are generally the weakest type of broadband signal processed by receivers, the present invention can also reliably receive other types of broadband signals—including signals transmitted by cable, and atmospherically transmitted signals.

The output of the IF amplifier 50 is demodulated and/or further broken down into subchannels, depending on the nature of the selected channel signal. For standard television video signals, the amplified channel signal 56 is processed by an FM demodulator 58, and the resulting signal can be feed directly into the video input port of a standard television.

Figure 3:
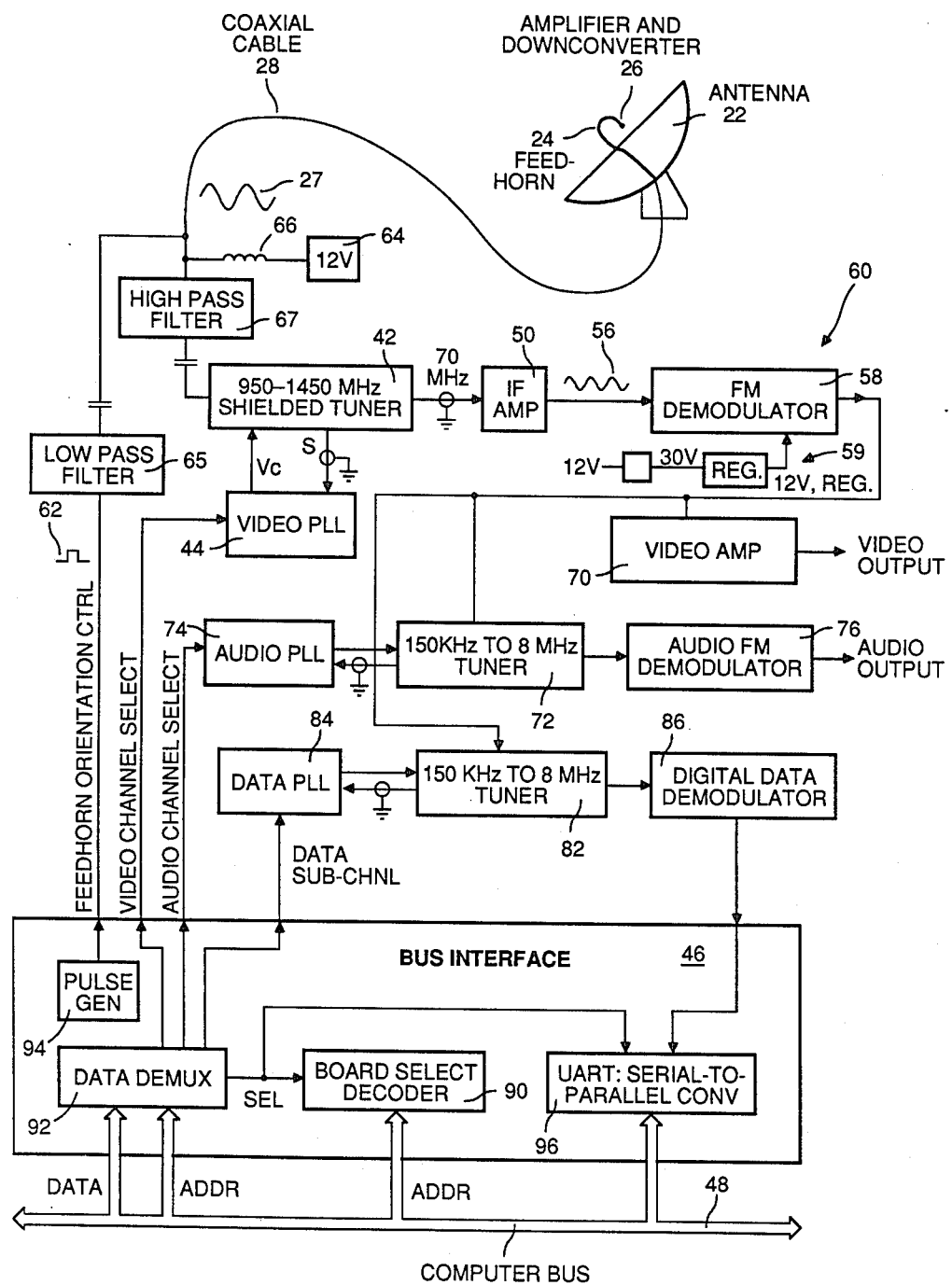
FIG. 3 is a detailed block diagram of a satellite receiver.

FIG. 3 is a detailed block diagram of a satellite receiver 60. The receiver 60 is used in conjunction with a satellite antennae 22, typically a parabolic antenna for microwave reception.

For this example it is assumed that the satellite signal is a microwave signal occupying approximately 500 MHz in the frequency range between 3.7 and 4.2 GHz. This 500 MHz range is divided into approximately twenty-four 40 MHz channels (using opposite polarizations on alternating channels), and each such channel includes a frequency modulated 5.0 MHz video signal and fourteen or more 100 KHz subchannels—some of which carry 20 KHz audio FM signals and others used to transmit data.

The antenna 22 is mounted external to the computer 30 (FIG. 1) and includes a feed assembly 24. In most applications the feed assembly will include a motorized or DC controlled polarization assembly so that the computer 30 can control the feed's polarization orientation to match the polarization of the satellite signal.

One feature of the present invention is that the d.c. power for the feed assembly 24, and the polarization control signal 62 are both transmitted to the feed assembly over the same coaxial cable used to transmit the broadband input signal 27 to the receiver 60. This is accomplished by coupling the computer's d.c. power supply 64 to the cable by a choke 66, and a.c. coupling the polarization control signal 62 to the cable through a low pass filter 65. The polarization control signal 62 in the preferred embodiment is a pulse width modulated signal that is low pass filtered (e.g., at 10 MHz) to ensure that this signal does not corrupt the much higher frequency input signal 27 (which is high pass filtered).

The operation of channel tuner 42, video PLL 44 and IF amplifier 50 are as described above with respect to FIG. 2. In particular, the tuner 42 selects one channel of the input signal 27 by mixing the input signal with a signal corresponding to the selected channel. The output of the tuner 42 has a center frequency of 70 MHz. One example of a suitable channel tuner 42 is the model HL-DBA31 tuner made by HWA Lin Electronic Co., Ltd. of Taiwan. An example of a suitable video PLL 44 is the model TD6350P frequency synthesizer made by Toshiba Corp.

The channel tuner 42 is a.c. coupled to the signal source (i.e., the antennae 22) through a high pass filter 67, with a low frequency cut off around 100 MHz, to protect the tuner 42 from low frequency signals and/or noise associated with the pulse generator 94 and d.c. power supply 64.

The amplified channel signal 56 is demodulated by an FM demodulator 58. In the preferred embodiment, the demodulator 58 uses a regulated twelve volt power supply 59, isolated from the computer's power supply so that the channel signal is detected without being affected by any noise in the computer's power supply. In other embodiments, the regulated power supply could be used for all of the components in the receiver 60 so that noise in the computer's power supply affects none of these components. However, the demodulator 58 is the most critical component and it is usually sufficient to isolate just this one component from the computer's power supply.

In the preferred embodiment, the output of the demodulator 58 is processed in three parallel paths. The main video signal is amplified by a video amplifier 70, producing a signal suitable for use in a standard television monitor. An audio subchannel is selected by a subchannel tuner 72 and an audio phase locked loop 74. The target carrier frequency of the VCO in the subchannel tuner 72 is selected by sending an appropriate data value to the audio PLL 74. In this example, the selected subchannel signal is translated into an audio output, suitable for driving an audio amplifier and speaker, by an audio FM demodulator 76.

A data subchannel is selected by a second subchannel tuner 82 and another phase locked loop 84 (herein called the data PLL). The target carrier frequency of the VCO in the subchannel tuner 82 is selected by sending an appropriate data value to the data PLL 84. In this example, the selected subchannel signal is translated into a binary data stream by a digital data demodulator 86 (e.g., an AFSK or FSK type demodulator).

The bus interface 46 in the receiver 60 works as follows. A board select decoder 90 monitors a predefined subset of the address lines $A_x$–$A_y$ on the computer bus 48. When the address value on these lines matches an address value assigned to the receiver, a select signal SEL is generated—which enables the operation of the other components in the bus interface 46.

A data demultiplexer 92 channels data on the data bus to the receiver when SEL is active—i.e., when the receiver is being addressed by the computer 30. A second subset of the computer's address lines $A_l$–$A_m$ are used by the demultiplexer 92 to determine the destination of the data within the receiver. Thus, the PLLs 44, 74 and 84, as well as a pulse generator 94, are each assigned different addresses and the demultiplexer is set up to that each receives the data on the data bus when the address signals match its preassigned address.

The pulse generator 94 generates pulses for controlling the polarization orientation of the feed assembly 24 in the satellite antenna 22. The feed assembly 24 contains a motor which responds to these pulses by changing the feedhorn's orientation by an amount corresponding to the width of the pulses received. In other embodiments, other similar methods could be used to control the polarization orientation of the feed assembly 24.

Finally, the bus interface 46 includes a UART (universal asynchronous receiver/transmitter) 96 for converting the serial data from the data demodulator 86 into parallel data for transmission onto the computer's bus 48. As will be understood by those skilled in the art, the destination of this data will depend on how the computer 30 is programmed to handle this data. Typical destinations include the computer's monitor, the computer's printer, and/or a disk file.

Figure 4:
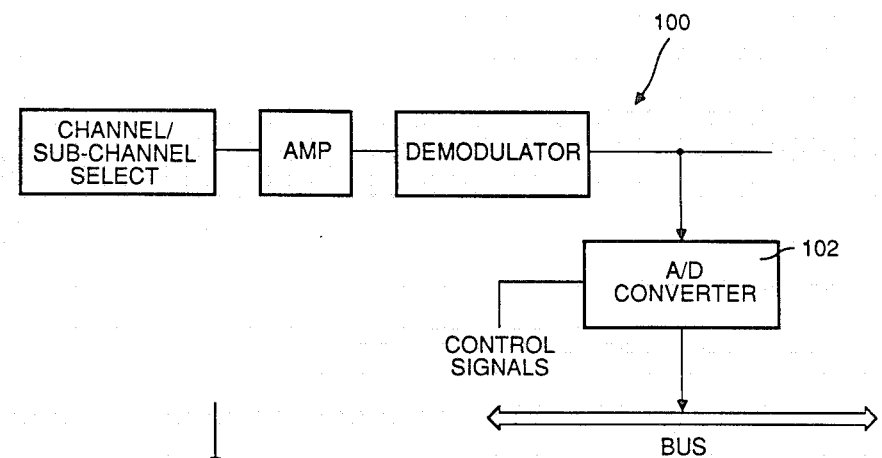
FIG. 4 depicts a channel or subchannel receiver with apparatus for converting an analog input signal into a digital signal for use in a computer.

FIG. 4 depicts a channel or subchannel receiver 100 with an analog to digital converter 102 for converting an analog input signal into a digital signal for use in a computer. This type of data conversion is needed whenever the data to be received is not transmitted in digital form. For example, the data transmitted by weather satellites is frequently transmitted in analog form for slow scan television.

Figure 5:
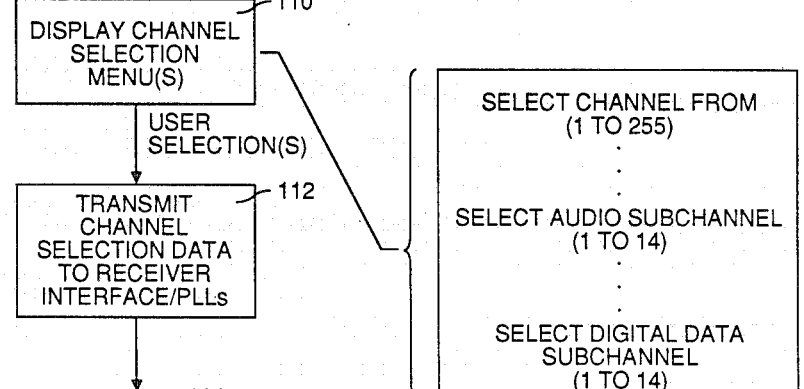
FIG. 5 depicts a flowchart of a computer program for programming a receiver such as the one shown in FIG. 2.

FIG. 5 depicts a flowchart of a computer program for programming a receiver such as the one shown in FIG. 3. The user is prompted (box 110) to select the channel, audio subchannel and digital data subchannel to be received. Once the use has made these selections, the corresponding data is transmitted to and latched into the phase locked loops in the receiver (box 112). As explained above, this is done by sending each set of data to the preassigned address corresponding to each phase locked loop component.

If no digital data is being collected (box 114), the program exits back to whatever program called this procedure. Otherwise, the user is prompted (box 116) to see if the received data is to be displayed on the computer's monitor, and to determine if the received data is to be stored on a disk file (box 118). Then the computer routes the received data to each selected destination (boxes 120 and 122). In other applications, the data could be routed to a printer, or a telephone modem, or any other defined destination. As will be understood by those skilled in the art, the data input handling for a satellite receiver is similar to handling the data input from a modem, except that the flow of data cannot be stopped and resumed using the XFF and XON protocols used with modems.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

I claim:

1. A programmable signal receiver for use in a computer system having a chassis for enclosing the components of said computer system, including a central processing unit (CPU) and a bus for transmitting data to and from said CPU, said signal receiver comprising:

input port means for receiving a broadband signal;

interface means for directly coupling said signal receiver to said bus for receiving instruction signals, including channel selection means for selecting at least one channel within said broadband signal in accordance with said instruction signals; and a programmable tuner coupled to said interface means, including means for storing data representing said at least one selected channel, and tuning means for each selected channel of said broadband signal for translating said selected channel to a predefined carrier frequency and for amplifying said translated signal, thereby producing an amplified channel signal, each said tuning means having amplifying means of sufficiently low impedance so that the RF radiation produced by said computer system does not corrupt said channel signal;

said signal receiver including means for mounting said interface means and said tuning means inside the chassis of said computer system, and shielding means for preventing radiation from said computer system from interfacing with the operation of said tuning means and for preventing radiation from said signal receiver from interfering with the operation of said computer system.

2. The signal receiver of claim 1, wherein said computer system includes a backplane port for removably connecting apparatus to said bus;

said programmable signal receiver includes connector means adapted for connecting said interface means to said backplane port in said computer system.

3. The signal receiver of claim 1, wherein said broadband signal is provided by a satellite antenna having a feed assembly, said feed assembly including orientation means to change the feed assembly's polarization orientation in accordance with a predefined polarization control signal; and said signal receiver further includes polarization orientation control means coupled to said interface means for receiving instruction signals specifying a polarization orientation for said feed assembly, said polarization orientation control means including control signal generating means coupled to said input port means for sending a polarization control signal to said feed assembly corresponding to said instruction signals.

4. The signal receiver of claim 3, wherein said computer system includes a d.c. power supply;

said satellite antennae feed assembly means is coupled to said input port by a single shielded cable;

said input port means is d.c. coupled to said d.c. power supply to supply d.c. power to said feed assembly orientation means; and said polarization orientation control means is a.c. coupled to said input port means;

whereby said single shielded cable conveys d.c. power and orientation control signals to said feed assembly and transmits said broadband signal from said satellite antenna to said input port means.

5. The signal receiver of claim 1, wherein said computer system includes a d.c. power supply;

said tuning means is a.c. coupled to said input port means; and said input port means is d.c. coupled to said d.c. power supply;

whereby said computer system's d.c. power supply provides power via said input port means to apparatus external to said computer system.

6. The signal receiver of claim 1, wherein each said tuning means includes:

phase locked loop means coupled to said channel selection means for generating a mixing signal with a frequency corresponding to said selected channel, signal tuning means for combining said broadband signal with said mixing signal, low pass filter means for filtering out the portion of the output of said tuning means which is outside said selected channel, and amplifying means for amplifying the output of said low pass filter means.

7. The signal receiver of claim 1, wherein one of said tuning means includes digital demodulation means for demodulating at least a portion of said amplified channel signal and thereby generating a stream of digital data; and said interface means includes data routing means, coupled to said digital demodulation means and said bus, for transmitting the stream of digital data from said demodulating means to said bus.

8. The signal receiver of claim 1, said programmable tuner including means for storing data representing a plurality of distinct selected channels, and a plurality of said tuner means for simultaneously producing amplified channel signals for a plurality of distinct selected channels.

* * * * *